(12) United States Patent
Veverka et al.

(10) Patent No.: US 11,280,211 B1
(45) Date of Patent: Mar. 22, 2022

(54) COMPRESSED GAS ENERGY HARVESTING SYSTEM

(71) Applicant: WESTERN ENTERPRISES/SCOTT FETZER, Westlake, OH (US)

(72) Inventors: Todd A. Veverka, Bay Village, OH (US); Gregory Brewer Eytchison, Huron, OH (US); Robert S. Kress, North Royalton, OH (US); John Walter Merrill, North Ridgeville, OH (US); Marius Milea, Westlake, OH (US)

(73) Assignee: Western Enterprises/Scott Fetzer Company, Westlake, OH (US)

( * ) Notice: Subject to any disclaimer, the term of this patent is extended or adjusted under 35 U.S.C. 154(b) by 351 days.

(21) Appl. No.: 16/262,419

(22) Filed: Jan. 30, 2019

Related U.S. Application Data

(60) Provisional application No. 62/623,849, filed on Jan. 30, 2018.

(51) Int. Cl.
| | |
|---|---|
| *F01D 15/10* | (2006.01) |
| *H02N 2/18* | (2006.01) |
| *F02C 1/02* | (2006.01) |
| *H01L 35/30* | (2006.01) |
| *H02K 7/18* | (2006.01) |

(52) U.S. Cl.
CPC ............. *F01D 15/10* (2013.01); *F02C 1/02* (2013.01); *H01L 35/30* (2013.01); *H02K 7/1823* (2013.01); *H02N 2/185* (2013.01)

(58) Field of Classification Search
CPC . F01D 15/10; F02C 1/02; H01L 35/30; H02K 7/1823; H02N 2/185
See application file for complete search history.

(56) References Cited

U.S. PATENT DOCUMENTS

| | | | | |
|---|---|---|---|---|
| 5,149,984 | A * | 9/1992 | Schultz | E21B 34/06 290/54 |
| 9,417,148 | B2 | 8/2016 | Eyring | |
| 2002/0163200 | A1* | 11/2002 | Oglesby | H01M 8/04111 290/52 |
| 2014/0265326 | A1* | 9/2014 | Allen | F01D 1/18 290/7 |

* cited by examiner

*Primary Examiner* — Viet P Nguyen
(74) *Attorney, Agent, or Firm* — Tarolli, Sundheim, Covell & Tummino LLP; John A. Yirga, Esq.

(57) ABSTRACT

A compressed gas energy harvesting system (CGEHS) for use in a gas delivery system is disclosed herein. The CGEHS comprises a gas control device connected to a compressed gas container and in fluid communication with a fluid within the compressed gas container. The gas control device comprising one or more electrical components. The CGEHS further includes a power storage device for providing power to the one or more electrical components and a potential energy converter coupled to the one or more electrical components, the potential energy converter for supplying power to at least one of the one or more electrical components and the power storage device by converting the potential energy retained by the compressed gas container into electrical energy.

20 Claims, 18 Drawing Sheets

COMPRESSED GAS ENERGY HARVESTING SYSTEM

CROSS REFERENCES TO RELATED APPLICATIONS

The following application claims priority to U.S. Provisional Patent Application Ser. No. 62/623,849 filed Jan. 30, 2018 entitled COMPRESSED GAS ENERGY HARVESTING SYSTEM. The above-identified application is incorporated herein by reference in its entirety for all purposes.

TECHNICAL FIELD

The present disclosure relates to pressurized containers and, in particular, relates to a gas control device that includes an energy-harvesting device that converts the potential energy in the pressurized container (e.g., a cylinder or tank) into electrical energy.

BACKGROUND

Pressure vessels such as cylinders, tanks, and dewars are used as containers to provide storage of compressed or liquefied gas. Gas control devices such as valves, pressure regulators, flowmeters, yokes, relief valves, and manifolds are frequently mounted onto these pressure vessels creating compressed gas delivery systems utilized in many medical, industrial, consumer, and commercial applications.

Known compressed gas delivery systems were typically mechanical in construction and operation. Valves, pressure regulators, connectors, and indicators operated without the use of electrical energy. Known compressed gas delivery systems typically incorporate conventional dial indicators (e.g., gauges) to provide a visual display to users visually conveying an amount of fluid and/or gas pressure stored in the pressure vessel.

Increasingly sophisticated electronic systems that incorporate basic telephony, sensors, control, status reporting, and various types of digital displays are being integrated into these compressed gas delivery systems to provide enhanced features and functionality. Further, utilizing cellular telemetry and electronic "connectivity" (e.g. Bluetooth, Wi-Fi, etc.) as enabling technologies, gas providers are developing and implementing asset tracking and monitoring solutions on these systems in an effort to reduce costs, eliminate waste, and drive operational excellence.

Many pressure vessel based compressed gas delivery systems are deployed as free-standing (or mobile) assets without an electrical connection or external source of power, and any electronics on these devices necessarily include a battery as an "onboard" power source.

In spite of the fact that fixed location compressed gas control devices could more readily incorporate "hard wired" electrical connection, most do not. Consequently, battery life, battery replacement, and overall power management represent both technical and practical challenges in many applications. These power management constraints currently represent a cost and/or benefit "trade off" associated with the availability of enhanced electronic functionality. This trade off adds cost and complexity to the gas delivery process and represents a disincentive to adoption of these innovations. U.S. Pat. No. 9,417,148 to Eyring et al. relates to pressurized containers and indicating assemblies. U.S. Pat. No. 9,417, 148 is incorporated by reference herein for all purposes in its entirety.

SUMMARY

An object of the present disclosure is to provide a Compressed Gas Energy Harvesting System for pressurized containers. The compressed gas energy harvesting system (CGEHS) for use in a gas delivery system is disclosed herein. The CGEHS comprised of a container, gas control device, the gas control device connected to a compressed gas container and in fluid communication with a fluid within the compressed gas container. The gas control device comprising one or more electrical components. The CGEHS further includes a power storage device for providing power to the one or more electrical components and a potential energy converter coupled to the one or more electrical components and or the power storage device, said potential energy converter for supplying power to at least one of the one or more electrical components and the power storage device by converting the potential energy retained by the compressed gas container into electric energy.

An object of the present disclosure is to provide a compressed gas energy harvesting system (CGEHS) for use in a gas delivery system, the CGEHS comprising a gas control device connected to a compressed gas container and in fluid communication with a fluid within the compressed gas container, said gas control device comprising one or more electrical components, a power storage device for providing power to the gas control device, and a potential energy converter coupled to at least one of the power storage device and the one or more electrical components, said potential energy converter for supplying power to at least one of the power storage device and the one or more electrical components by converting the potential energy retained by the compressed gas container into electrical energy.

An additional object of the present disclosure is to provide a compressed gas energy harvesting system (CGEHS) for use in a gas delivery system, the CGEHS comprising a gas control device connected to a compressed gas container and in fluid communication with a fluid within the compressed gas container, said gas control device comprising one or more electrical components, a power storage device for providing power to the gas control device, and a potential energy converter coupled to at least one of the power storage device and the one or more electrical components, said potential energy converter for supplying power to at least one of the power storage device and the one or more electrical components by converting the potential energy retained by the compressed gas container into electrical energy.

Yet another object of the present invention is to provide a compressed gas energy harvesting system (CGEHS) comprising a gas control device connected to a compressed gas container and in fluid communication with a fluid within the compressed gas container, wherein the gas control device defines a fluid flow path from the compressed gas container to a gas output port, said gas control device comprising first and second ports along the flow path, said gas control device comprising one or more electrical components, a power storage device for providing power to the gas control device, and an induction device in fluid communication with the flow path via the first and second ports, the induction device coupled to at least one of the power storage device and the one or more electrical components, said induction device for supplying power to at least one of the power storage device and the one or more electrical components by converting a potential energy retained by the compressed gas container into electrical energy by converting the fluid flowing through the induction device into electrical energy.

BRIEF DESCRIPTION OF THE DRAWINGS

The foregoing and other features and advantages of the present disclosure will become apparent to one skilled in the art to which the present disclosure relates upon consideration of the following description of the disclosure with reference to the accompanying drawings, wherein like reference numerals refer to like parts unless described otherwise throughout the drawings and in which.

DETAILED DESCRIPTION

Referring now to the figures generally wherein like numbered features shown therein refer to like elements throughout unless otherwise noted. The present disclosure relates to pressurized containers and, in particular, relates to a gas control device that includes an energy harvesting device that converts the potential energy in the pressurized container (e.g., a cylinder or tank) into electrical energy.

Figure 3:
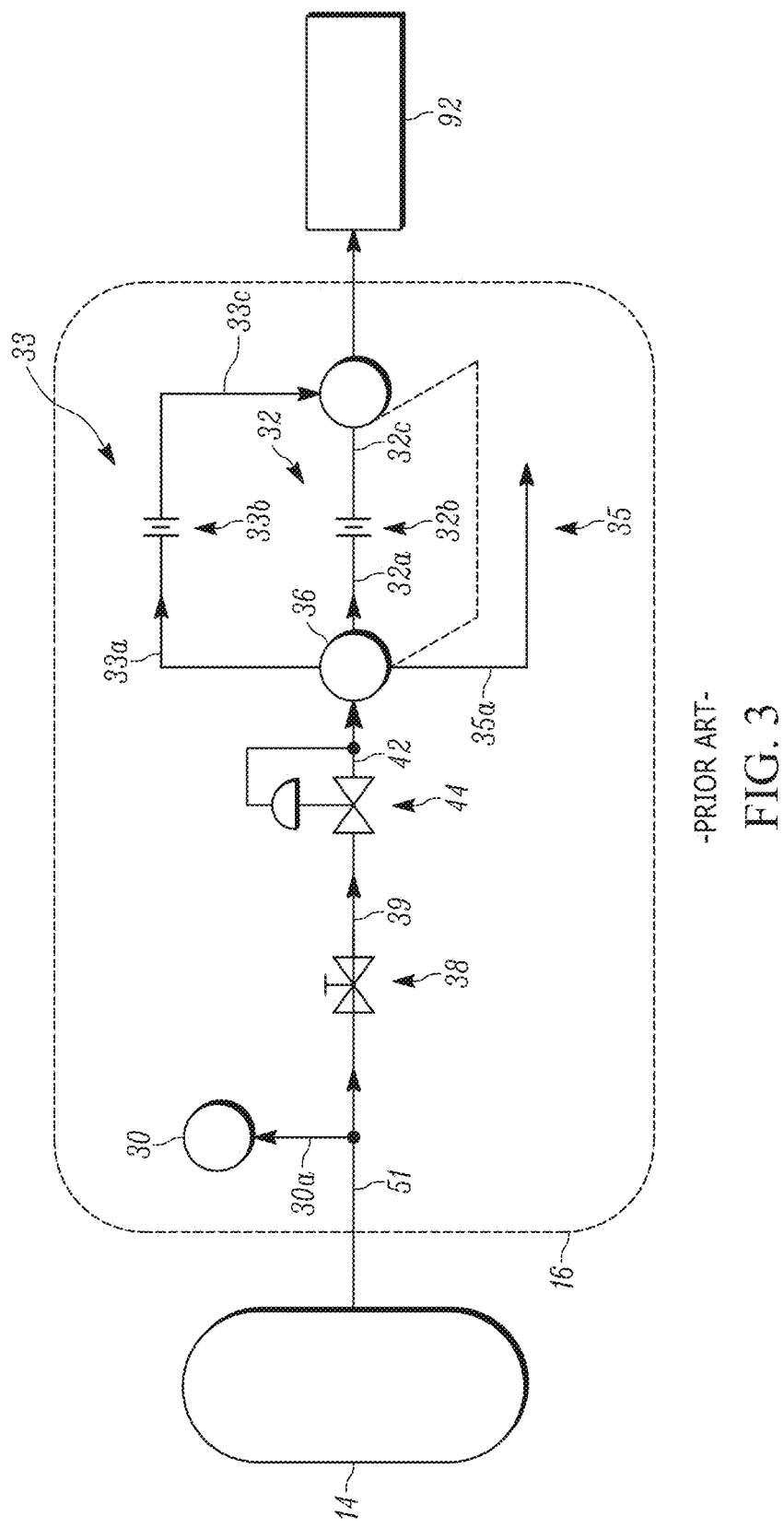
FIG. 3 is a schematic illustration of a typical flow path in a gas control device in accordance with one example embodiment.

As illustrated in the example embodiment of FIG. 3, a typical flow path through a known gas control device 16 is illustrated. In this example embodiment, gas flows from a gas cylinder 14 along a connector path 51, past a connection to a pressure gauge 30 (e.g., a pressure sensor or indicator), to a shut-off valve 38, such as a manual high pressure shut-off valve. Responsive to the shut-off valve 38 remaining open, gas flows to a pressure adjustment device, hereinafter a pressure regulator 44. The pressure regulator 44 controls a pressure of gas that flows through said pressure regulator. Regulated gas then flows to a flow selector 36, which designates whether the regulated gas travels through a first or a second channel 32, 33 to a first port 92. Responsive to the flow selector 36 indicating the first channel 32 the gas flows through a first flow path 32a, a first orifice 32b, a first orifice path 32c and out of the first port 92, and responsive to the flow selector 36 indicating the second channel 33 the gas flows through a second flow path 33a, a second orifice 33b, a second orifice path 33c and out of the first port 92. Responsive to a flow path being selected using the flow selector 36, other flow paths and corresponding orifices are removed from the gas flow path (e.g., the non-selected flow paths are isolated). It would be appreciated by one having ordinary skill in the art, the flow selector 36 comprises multiple flow paths and orifices that define flow paths to a single port. The flow selector 36 additionally comprises a shutoff position 35.

Referring now to FIGS. 1, 2, 7, 13-17 a compressed gas energy harvesting system (CGEHS) 112 is proposed that is an element of a compressed gas delivery system 110. In the illustrated example embodiment of FIGS. 1, 2, 7, 13-17 a flow path through a gas control device 116, wherein a CGEHS 112 is connected, is illustrated. Features of the known gas control device 16 illustrated in FIG. 3 that are similar to the features of the gas control device 116 illustrated in FIG. 4 will be identified by like numerals increased by a factor of one-hundred.

The CGEHS 112 is in communication with the gas control device 116 and/or a pressurized container 114. The CGEHS 112 harvests electrical energy from the potential energy contained in the pressurized container 114 (e.g., a pressure vessel, compressed gas cylinder, dewar, or the like). This potential energy is converted to electrical energy (such as, electrical current, induction current, or some other form of usable energy) and the electrical current is: a) stored in a power storage device 166 (e.g., a battery or the like) in the CGEHS 112 (see FIG. 19); b) stored in a power storage device 166 that is comprised within the gas control device 116; and/or c) utilized, with little to no storing of the current, as a local and/or onboard source of electrical power for any gas control associated devices 172, for example, a control for gas flow or pressure device (e.g., a valve, solenoid, and the like), a sensing device, a display device, a communication device, and/or telemetry device integrated onto the gas delivery system 110).

Figure 1:
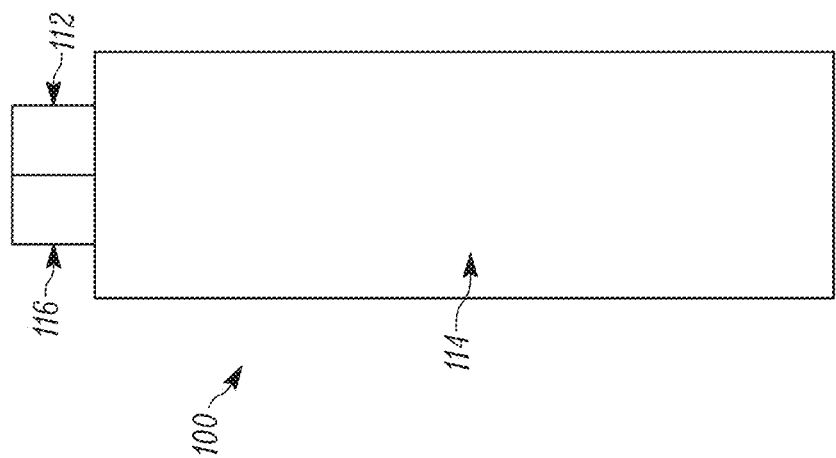
FIG. 1 is a schematic illustration of a compressed gas delivery system including a container, gas control device, wherein a compressed gas energy harvesting system (CGEHS) is in communication with the gas control device and/or the container.
Figure 2:
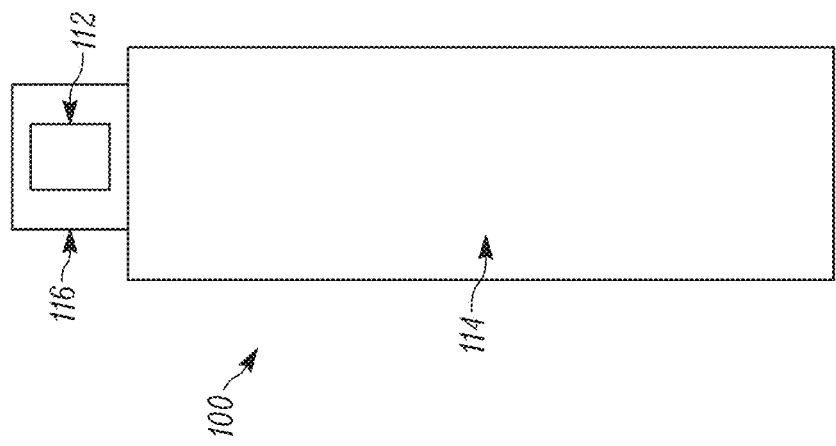
FIG. 2 is a schematic illustration of a compressed gas delivery system including a container, a gas control device, and a CGEHS integrated into the gas control device.

In the illustrated example embodiment of FIG. 2, the CGEHS 112 is an integral element of a gas control device 116 within the compressed gas delivery system 110. The gas control device 116 is in fluid communication with the pressurized container 114. In this embodiment, the CGEHS 112 is integrated into the gas control device 116. The CGEHS 112 harvests electrical energy from the potential energy contained in the container 114, whenever the flow of gas occurs. This potential energy is converted to electrical energy and the electrical energy is: a) stored in the power storage device 66 in the CGEHS 112; b) stored in the power storage device 66 in the gas control device 116, and/or c) immediately utilized as a local and/or onboard source of electrical power for any gas control device 116, for example, a control for gas flow or pressure device (e.g., a valve, solenoid, and the like), a sensing device, a display device, a communication device, and/or telemetry device integrated onto the gas delivery system 110). The potential energy in the cylinder 114 is harvestable by the CGEHS 112 via several technologies. These technologies include, but are not limited to, a) piezoelectric harvesting devices that are capable of generating electrical current in response to the mechanical strain and stress created by pressure changes within a gas stream, b) magnetic induction devices 118, that, for example, use magnets mounted to gas control device components (e.g. a regulator diaphragm or regulator piston), and/or within a CGEHS housing 117 that moves linearly during gas flow (not shown), and/or an diverter 124 placed in the gas path, coupled to a fan and/or turbine 120, and a generator 120 that rotates in response to gas flow (see, for example, FIG. 13), or c) thermoelectric devices (e.g. a Peltier device) that can harvest power from the temperature differentials in a cryogenic container, or by the temperature differentials created within the gas control device as the gas changes pressure and expands and/or compresses during gas flow. The induction device 118 comprises a generator, a rotating magnetic induction device, etc. In one example embodiment, thermoelectric devices are used in cryogenic applications where large temperature differentials exist continuously in the compressed gas delivery systems 110.

In one example embodiment, electrical power is harvested by the CGEHS 112 responsive to gas flowing out of a cryogenic tank 114 through a pressure relief valve (not shown) as the cylinder 114 gradually vents gas from evaporation. In another example embodiment, electrical power is harvested by the CGEHS 112 responsive to gas flowing through the gas control device 116 into the cylinder 114 (or any compressed gas source) during a fill operation (e.g., when the cylinder is being filled with fluid and/or gas). In yet another example embodiment, electrical power is harvested by the CGEHS 112 responsive to continuously active thermoelectric devices that are in communication with the cryogenic tank. In yet one more example embodiment, electrical power is harvested by the CGEHS 112 "on demand" wherein, there is a "call for power" (e.g. a "low battery" indication from the gas control device 116 and/or some other device connected to the CGEHS). For example, responsive to a separate system initiating a gas flow through the CGEHS 112, the CGEHS harvests the available energy as needed.

In the illustrated example embodiment of FIG. 2, the CGEHS 112 is fully integrated into the gas control device 116. In the illustrated example embodiment of FIG. 1, the CGEHS 112 is an "add on" unit adapted to access the energy in the compressed gas control device 116, container, tank, and/or system.

Electrical power is harvested by the CGEHS 112 responsive to the gas flowing through the gas control device 116 out of the cylinder 114 (or any compressed gas source) during use. In the illustrated example embodiment of FIGS. 4 and 7-17, a flow path through the gas control device 116 with various locations for connecting the CGEHSs 112 is illustrated. First, second, third, and fourth CGEHSs 112a, 112b, 112c, 112d are illustrated in four locations in the flow path of the gas control device 116. In this example embodiment, at least one of the first, second, third, and fourth CGEHSs 112a, 112b, 112c, 112d are present in the compressed gas delivery system 110.

In the illustrated example embodiment of FIGS. 4, 7-10, 13-17, the third CGEHS 112c is positioned in the gas flow path between a pressure regulator output 142 of the pressure regulator 144 and a flow selector input 142a of a flow selector 136. The third CGEHS 112c is connected to the gas control device 116 by first and second connectors 113a, 113b, which define a flow path from the gas control device 116 to the third CGEHS and from the third CGEHS back to the gas control device. In one example embodiment, the gas comprises one of an elemental gas, a gas mixture, manmade, natural, and/or a combination thereof. A regulator output port 147 is formed in the gas control device 116, wherein air/gas from the pressure regulator 144 travels through the pressure regulator output 142 to the regulator output port 147. A flow selector input port 149 is formed in the gas control device 116. The flow selector input port 149, when fluidly connected to the regulator output port 147, receives gas flow from the pressure regulator 144. In this example embodiment, the gas control device 116 comprises metal, such as brass, aluminum, stainless steel, ferrous and non-ferrous metals, or a combination thereof, or plastic, including synthetic polymers, such as polyamides (e.g., nylon), Polytetrafluoroethylene (e.g., Teflon®), polyether ether ketone (e.g., PEEK). The gas control device 116, and the various gas flow paths are formed by at least one of molding, injection molding, stamping, machining, welding, or the like. As shown in the illustrated example embodiments of FIGS. 9-12, the gas control device 116 is formed to comprise both the regulator output port 147 and the flow selector input port 149.

Responsive to the third CGEHS 112c being fluidly connected to the regulator output port 147 and the flow selector input port 149 by the first and second connectors 113a, 113b, respectively, the gasflow path is diverted through the regulator output port 147 through the third CGEHS 112c and through to the flow selector input port 149. In one example embodiment, the regulator output port 147 and the flow selector input port 149 comprise a connecting apparatus for connecting to the CGEHS 112 and/or the first and second connectors 113a, 113b, including nuts, nipples, clamps, screws, threaded connection, or a combination thereof. The regulator output port 147 and the flow selector input port 149 comprises a diameter between about 2 mm to about 3 mm.

In one example embodiment, the third CGEHS 112c is fluidly connected to the regulator output port 147 and the flow selector input port 149 by the first and second connectors 113a, 113b, respectively, wherein the flow path is diverted between the pressure regulator 144 and the flow selector 136. The first and second connectors 113a, 113b comprise at least one of a gas impermeable and/or nonreactive material, such as brass, stainless steel, polytetrafluoroethylene, re-enforced silicone, and/or any combination thereof. The first and second connectors 113a, 113b are one of integrally formed with a housing 117 of the third CGEHS 112c and/or are attachable and detachable from the housing. In one example embodiment, the first and second connectors 113a, 113b are coupled to at least one of the regulator output port 147 and the flow selector input port 149 via at least one of clamps, screws, nuts, nipples, clamps, screws, threaded connection, and/or a combination thereof. In another example embodiment, the first and second connectors 113a, 113b are integrally formed with the regulator output port 147 and the flow selector input port 149 via molding, forging, machining, etc.

The first and second connectors 113a, 113b comprise an internal flow diameter of between about 2 mm to about 3 mm. In this example embodiment, the first and second connectors 113a, 113b structurally support the third CGEHS 112c, such that the first and second connectors maintain a position of the third CGEHS 112c. In another example embodiment, the gas control device 116 structurally supports the third CGEHS 112c.

Figure 7:
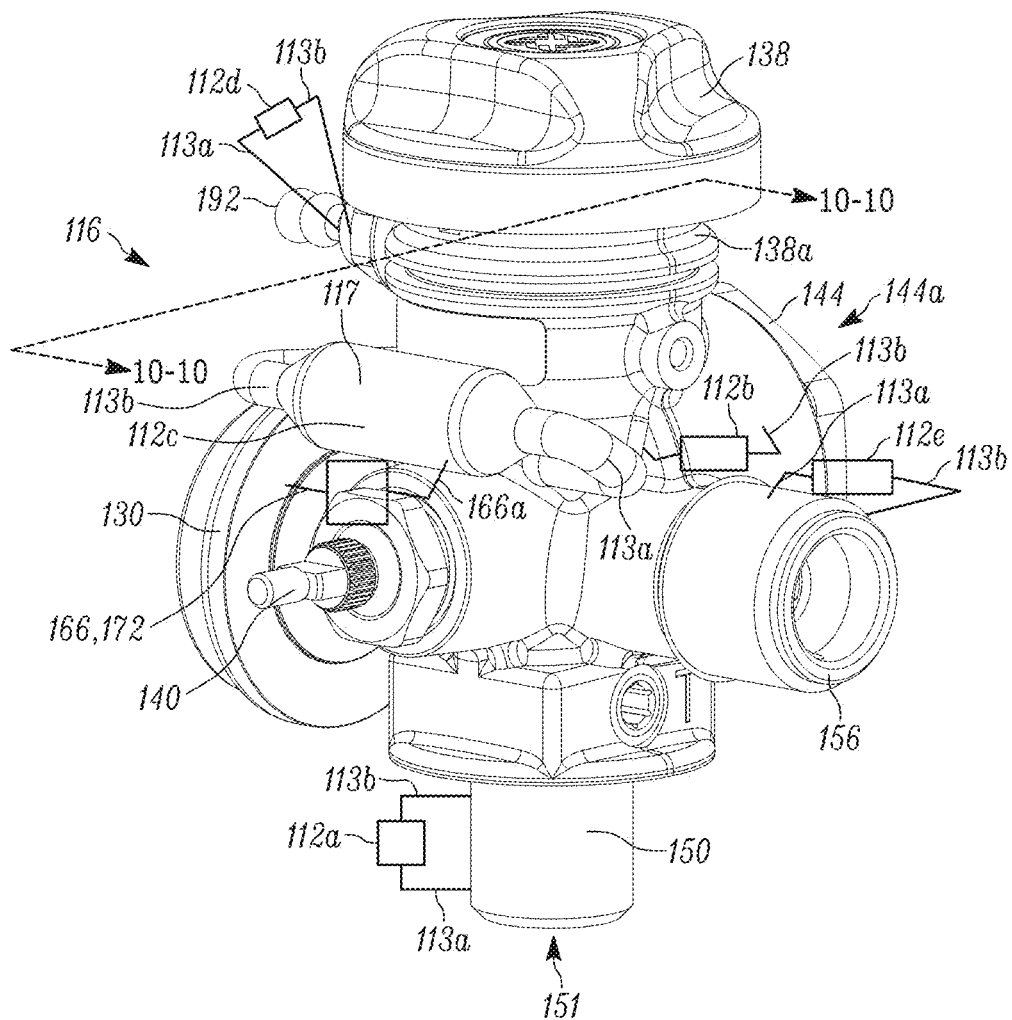
FIG. 7 illustrates a gas control device in fluid communication with a CGEHS, in accordance with another example embodiment.
Figure 8:
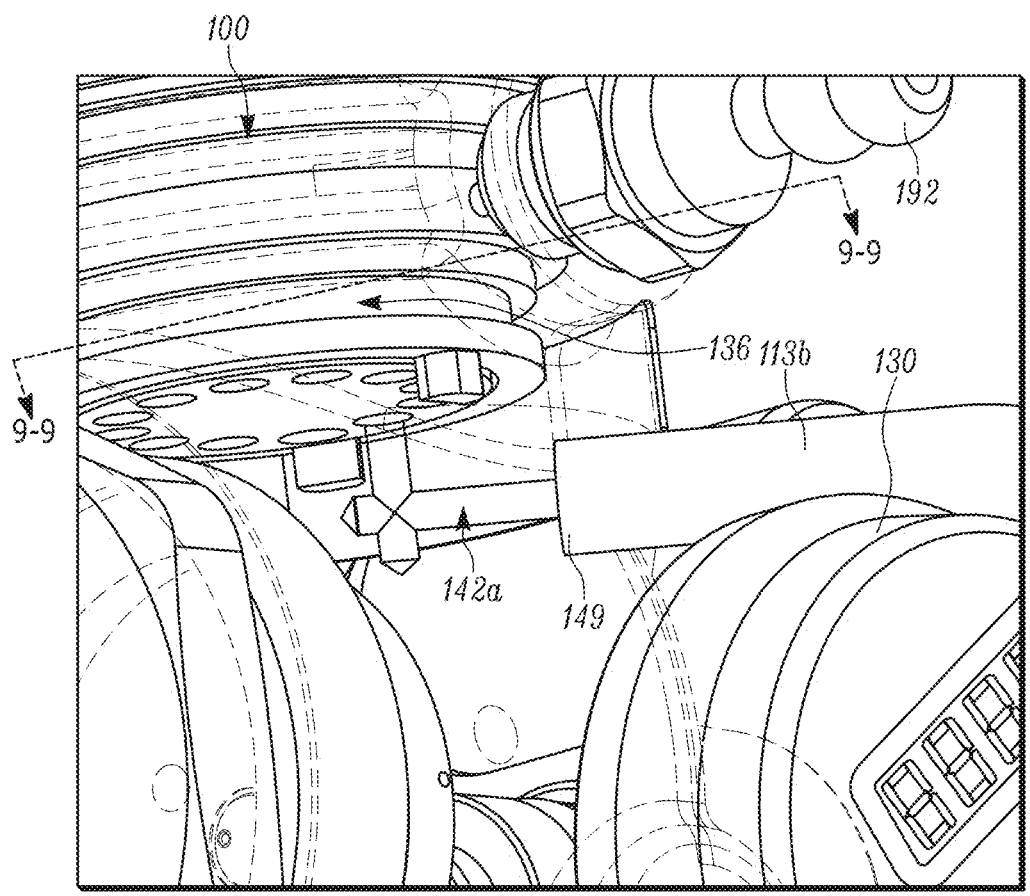
FIG. 8 is a magnified rear view of FIG. 7, wherein portions of the gas control device are shown in phantom, in accordance with another example embodiment.
Figure 9:
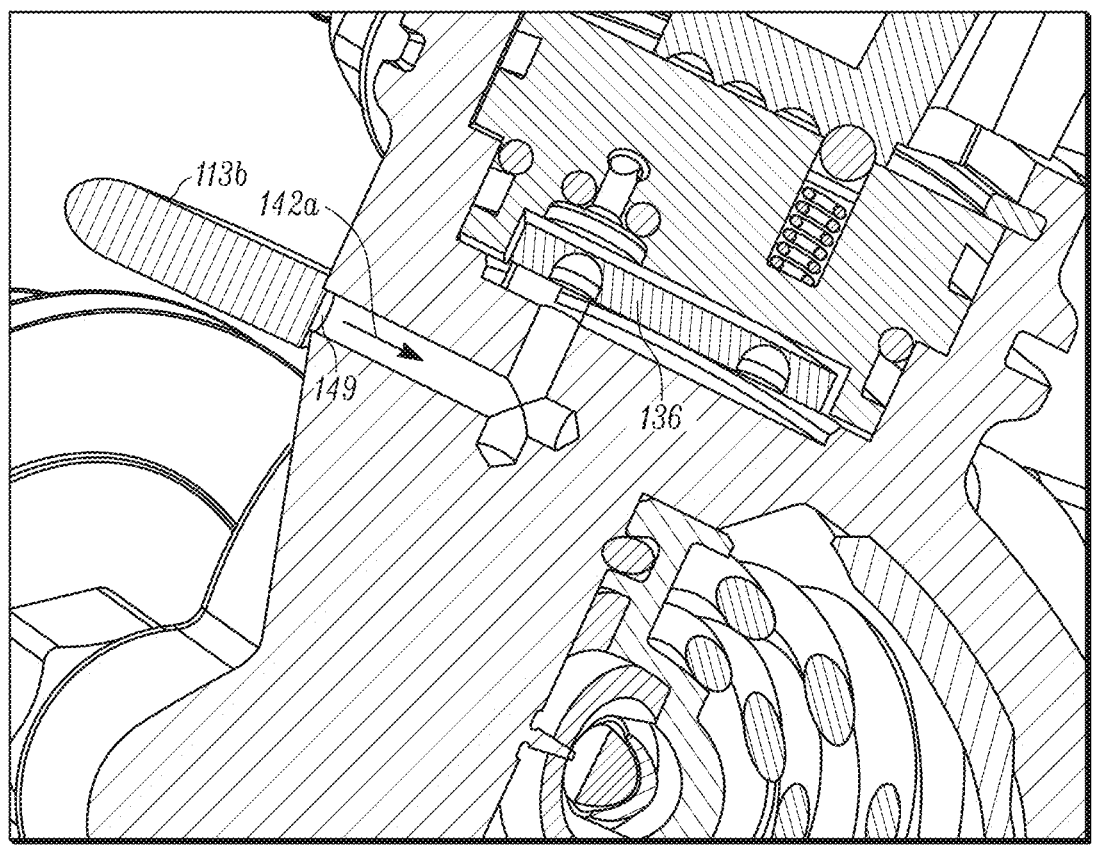
FIG. 9 is a cross-section view taken along lines 9-9 of FIG. 8.
Figure 10:
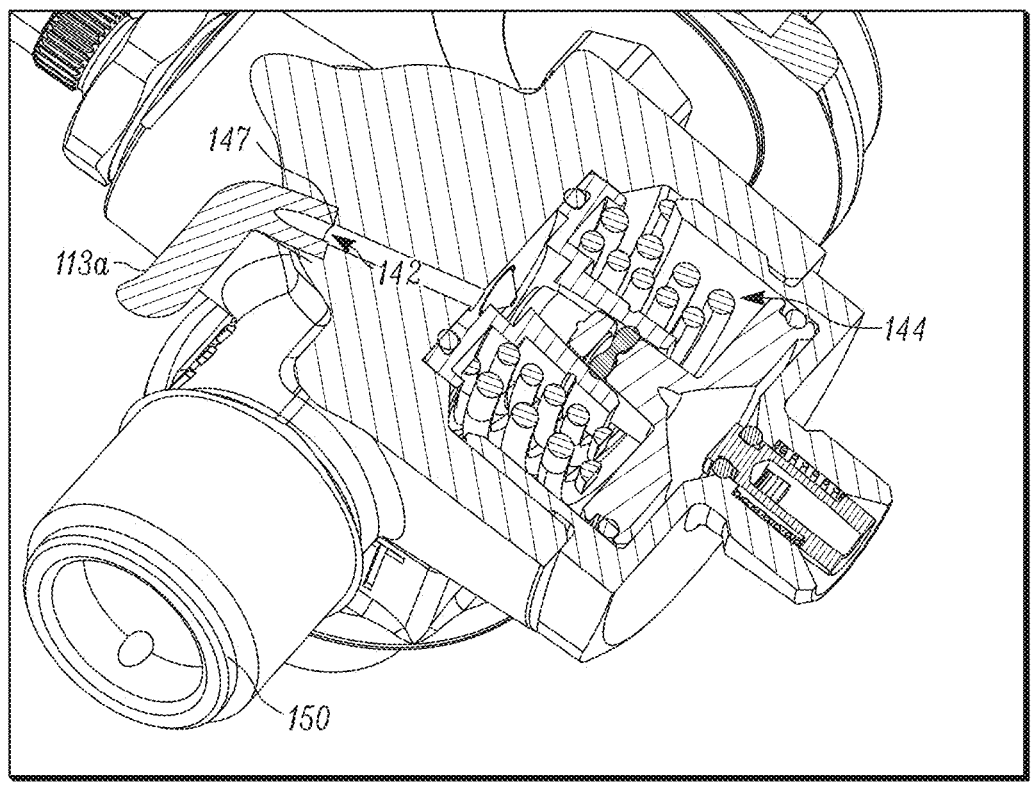
FIG. 10 is a cross-section view taken along lines 10-10 of FIG. 7.
Figure 11:
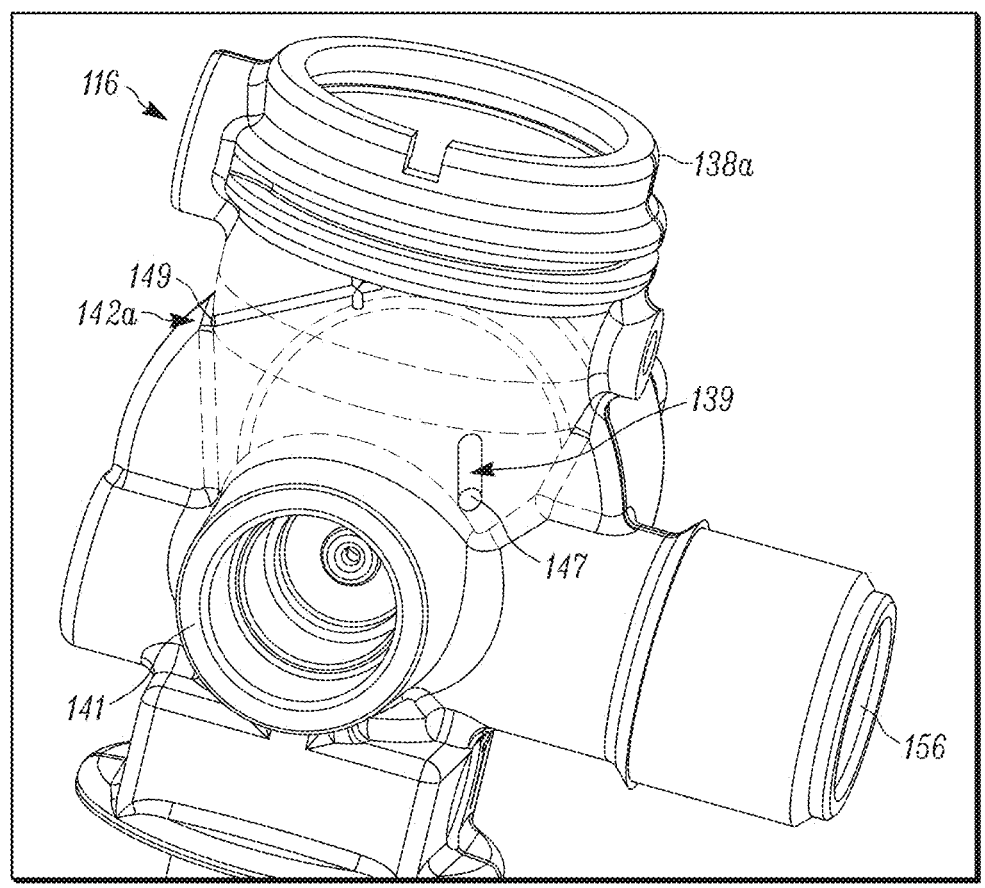
FIG. 11 illustrates a simplified gas control device wherein paths of fluid communication available for use with a CGEHS are illustrated through portions of the gas control device that are illustrated in phantom, in accordance with another example embodiment.
Figure 12:
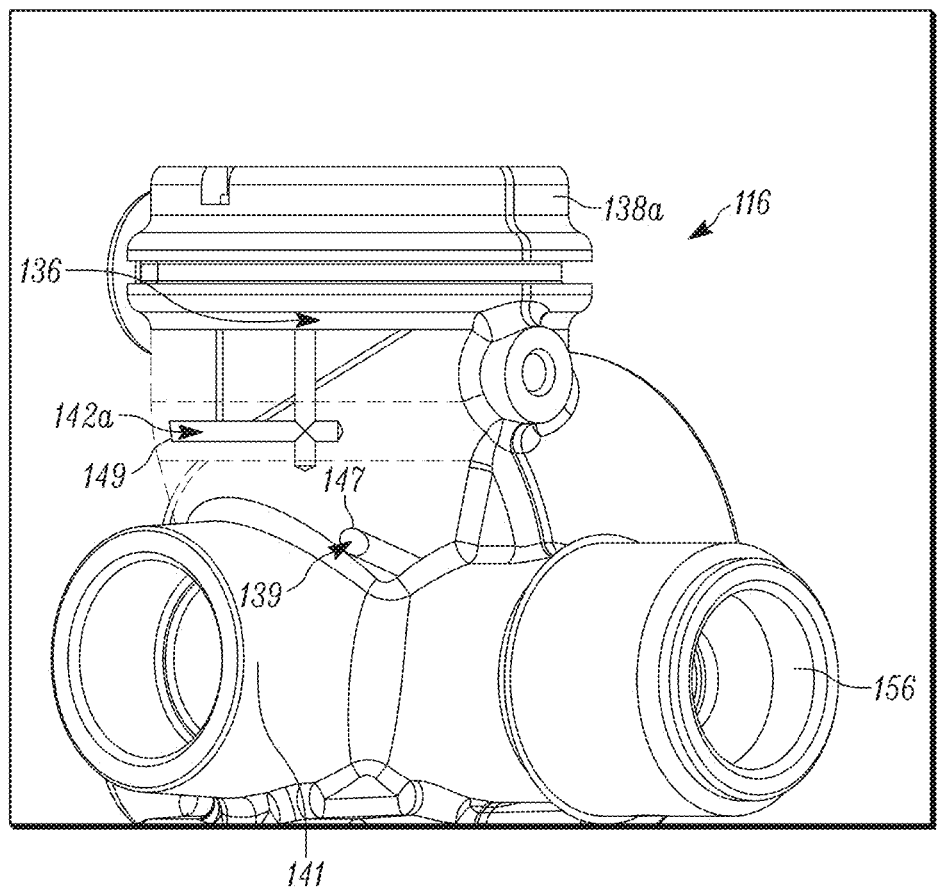
FIG. 12 is a partially magnified partially rotated view of FIG. 11.

In the illustrated example embodiment of FIG. 7, the housing 117 comprises at least one of a gas impermeable material such as brass, stainless steel, aluminum and/or any combination thereof. The housing 117 additionally comprises a semi-rigid or rigid material, such as brass, stainless steel, aluminum, polytetrafluoroethylene and/or any combination thereof, to support the induction device 118, which resides within the housing. In one example embodiment, the housing 117 is connected to the generator 122, wherein the generator rotationally supports the turbine 120 and the diverter 124. It would be appreciated by one having ordinary skill in the art that various induction and/or piezoelectric devices are contemplated, including oscillating, rotating, and other electricity generating mechanisms. Further, it would be appreciated by one having ordinary skill in the art that the gas control device 116 can be integrally formed with the CGEHS 112, wherein, the CGEHS is formed within the gas control device (e.g., the housing 117, supporting the induction device 118, is formed as part of the gas control device).

Figure 5:
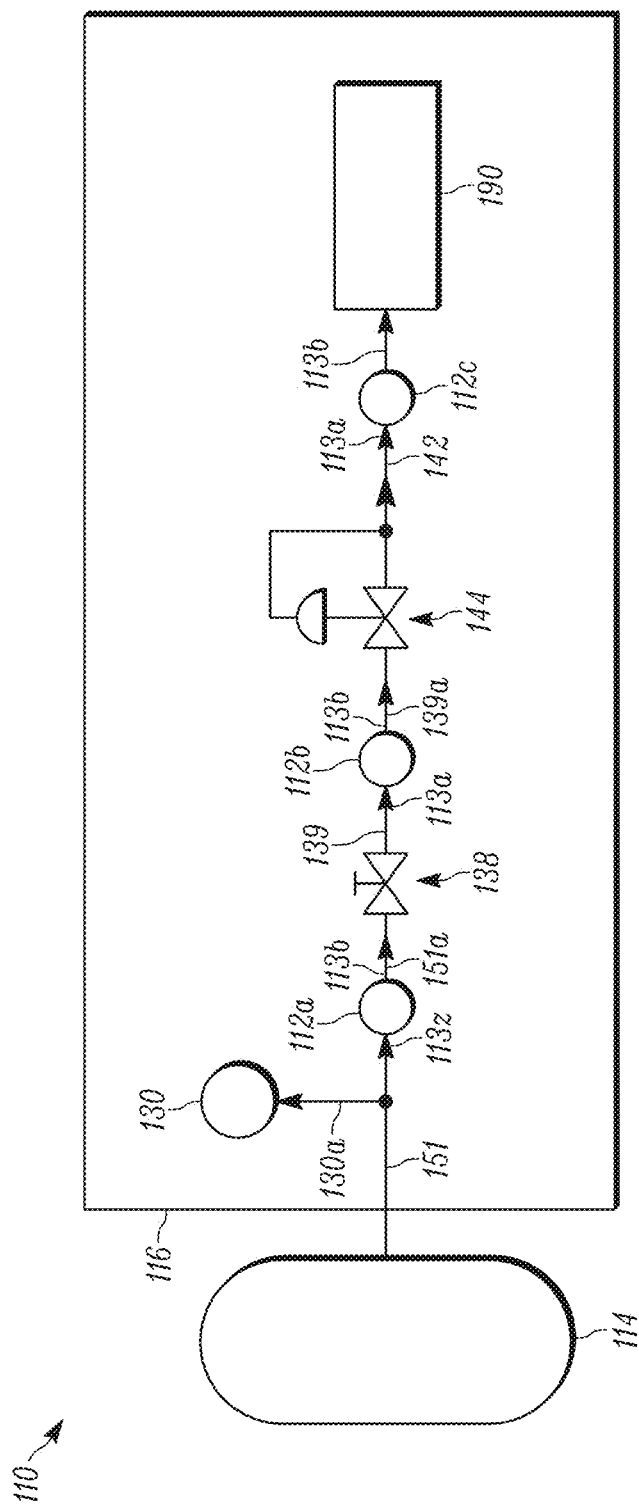
FIG. 5 is a schematic illustration of a flow path in a gas control device and locations wherein a CGEHS is integratable into the flow path are illustrated, in accordance with another example embodiment.

In the illustrated example embodiment of FIG. 5, the gas control device 116 lacks the flow selector 136. In this example embodiment, the third CGEHS 112c is connected to the regulator output port 147 and an input port 153 that defines an entry point to a gas flow output path 134 that leads to the port 192. The third CGEHS 112c is connected to the input port 153 in the same manner as described above with regards to the flow selector input port 149.

Figure 4:
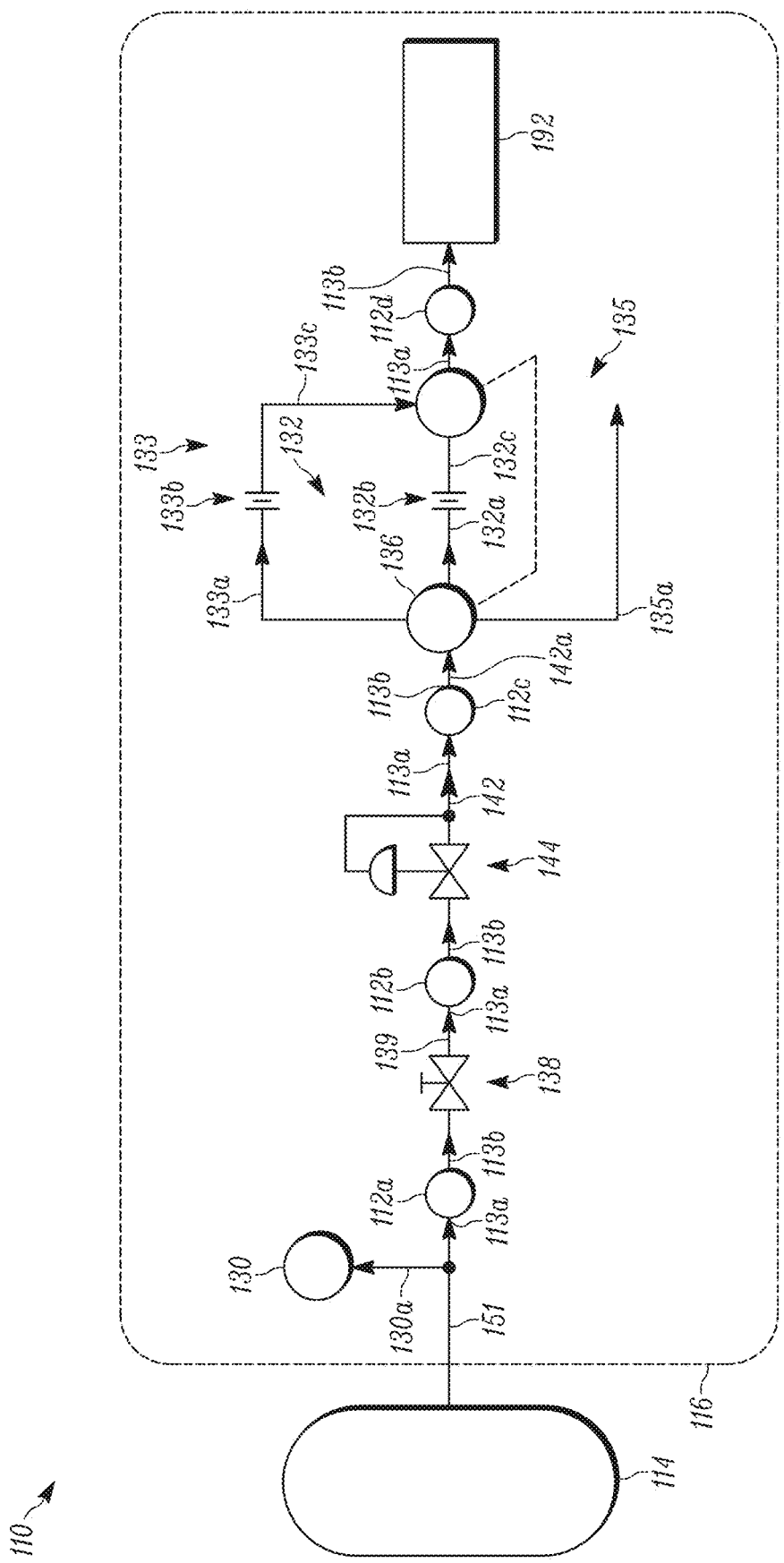
FIG. 4 is a schematic illustration of a flow path in a gas control device and locations wherein a CGEHS is integratable into the flow path are illustrated, in accordance with one example embodiment.

In the illustrated example embodiments of FIGS. 4 and 7, the first, second, and fourth CGEHSs 112a, 112b, 112d, are connected along the flow path by the first and second connectors 113a, 113b at respective locations in a same or similar manner as described above with regard to the first and second connectors 113a, 113b connected to the third CGEHS 112c. In one example embodiment, the first and second connectors 113a, 113b connect the first CGEHS 112 along the connector flow path 151 between the pressurized container 114 and the shut-off valve 138. In another example embodiment, the first and second connectors 113a, 113b connect the second CGEHS 112b along a valve flow path 139 between the shut-off valve 138 and the pressure regulator 144. In yet another example embodiment, the first and second connectors 113a, 113b connect the fourth CGEHS 112d along the gas flow output path 134 between the flow selector 136 and the port 192. Wherein, in each of the preceding example embodiments, the gas control device 116 is formed to comprise ports associated with each flow path, in a same manner as described above with regard to the regulator output port 147 and the flow selector input port 149.

Further, as shown in the illustrated example embodiment of FIG. 7, the first CGEHS 112a is positioned along the connector flow path 151 between the cylinder 114 and the shut-off valve 138. The first CGEHS 112a is connected to at least one of a gas connector portion 150 of the gas control device 116, and/or acts as the connector portion, connecting the gas control device to the cylinder 114. In this example embodiment, the first CGEHS 112a is comprised of oxygen ignition resistant materials, such as brass, polytetrafluoroethylene, etc.

Figure 6:
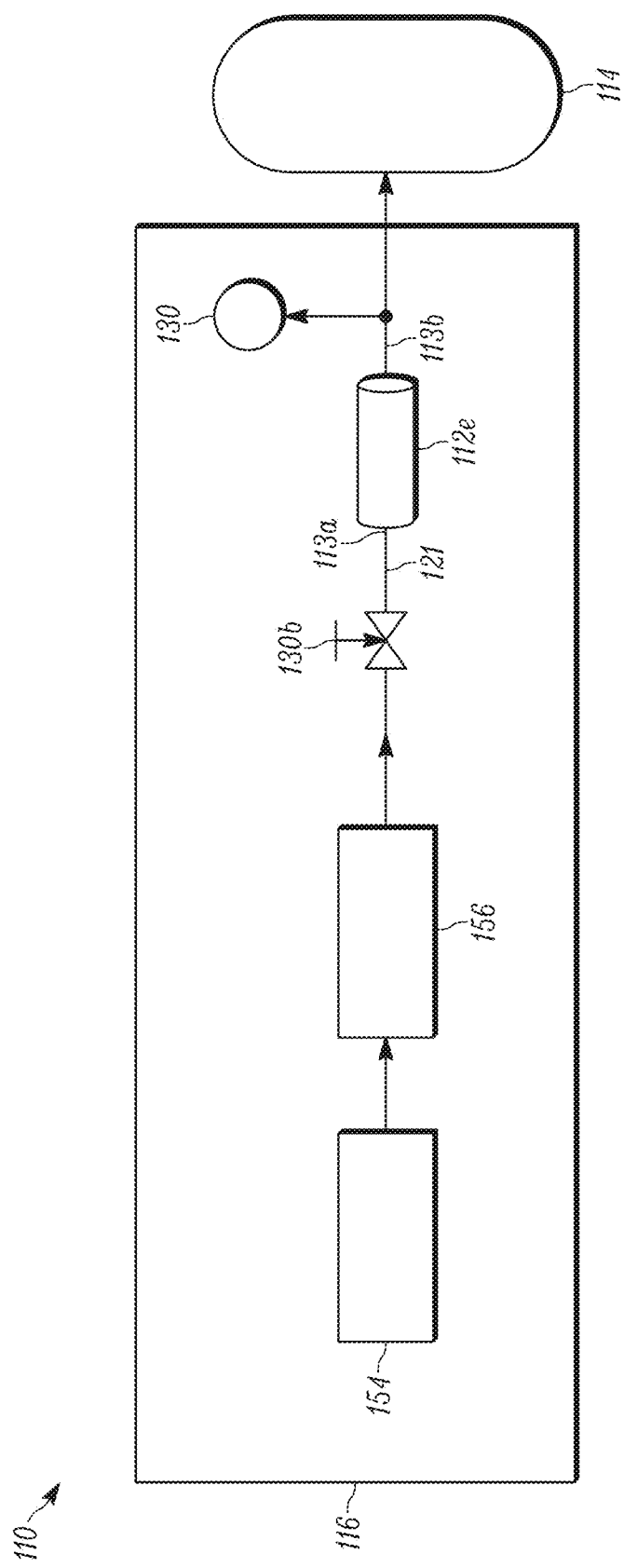
FIG. 6 is a schematic illustration of a fill flow path in a gas control device and locations wherein a CGEHS is integratable into the fill flow path are illustrated, in accordance with another example embodiment.

As illustrated in the example embodiment of FIG. 6, the CGEHS 112 generates power during a fill event of the pressurized container 114. In this example embodiment, the CGEHS 112 can be in any one or more of the first, second, third, and/or fourth locations. Additionally, the first and second connectors 113a, 113b connect a fifth CGEHS 112e along a valve fill path 121 between a gas fill valve 130b and the pressure gauge 130 and/or the pressurized container 114. Wherein, in this example embodiment, the gas control device 116 is formed to comprise ports associated with valve fill path 121, in a same manner as described above with regard to the regulator output port 147 and the flow selector input port 149. Further, wherein the first and second connectors 113a, 113b are connected in a same or similar manner as the first and second connectors 113a, 113b described with regard to the third CGEHS 112c.

Figure 18:
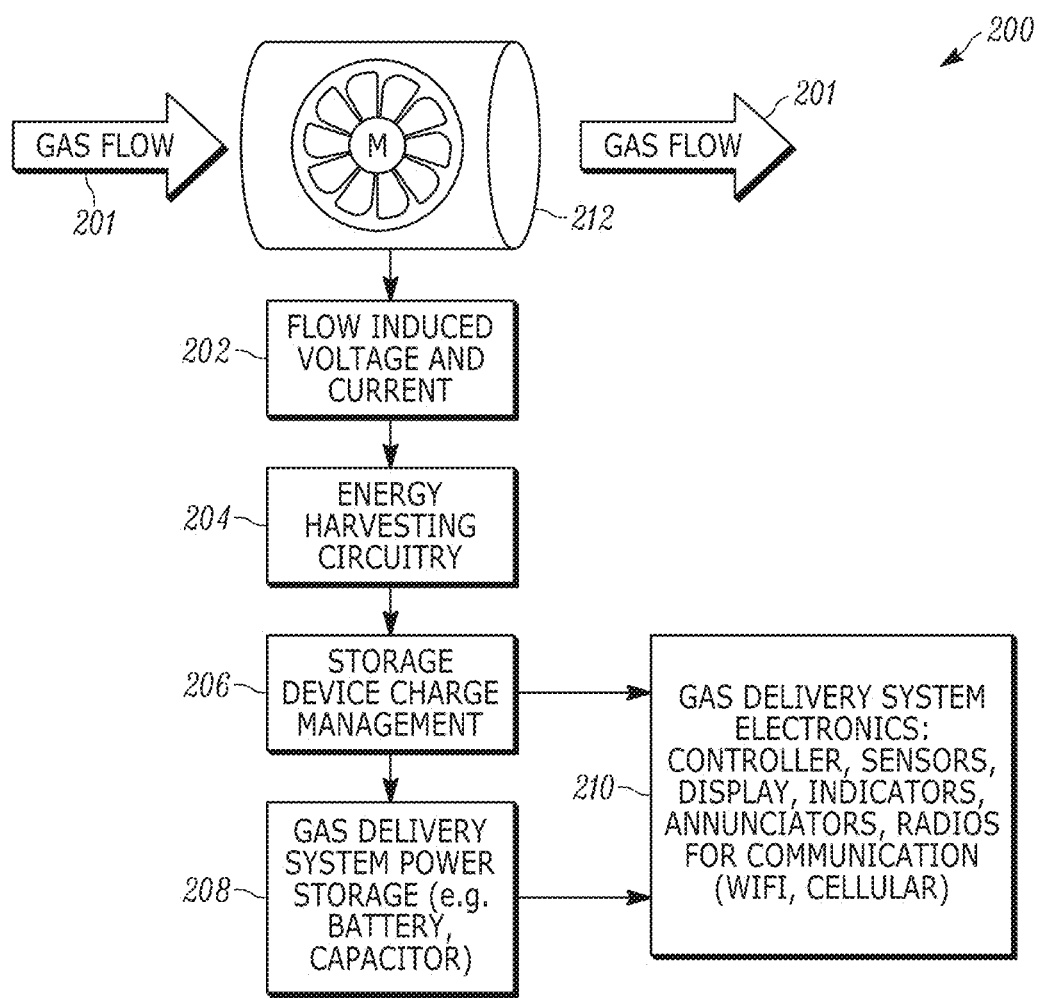
FIG. 18 is a flow chart illustrating energy collection, output, and storage by the CGEHS.

As shown in the illustrated example embodiment of FIG. 18, a method 200 of energy collection is illustrated. At 202, gas flow 201 is harvested as flow induced kinetic energy, wherein the potential energy present in the pressurized container 114 (e.g., gas under pressure) is converted into electric energy by the induction device 118 of the CGEHS 112 when the gas flows through the CGEHS 112. At 204, the electric energy is transmitted to energy harvesting circuitry, the energy harvesting circuitry comprising circuitry such as a microcontroller 162, and/or components in a power storage device 166 (see FIG. 19) that regulate/convert electric energy into a specific current, such as alternating or direct current, at a specific amperage (e.g., an alternator, a generator, etc.). At 206, the electric energy is transmitted through a storage device charge management device, which regulates and/or monitors an amount of energy to be stored in the power storage device 166. In one example embodiment, the storage device charge management device comprises one of analog devices LTC xxxx or similar. At 208, the kinetic energy is stored in the power storage device 166 (e.g., a battery, a capacitor, etc.) as potential energy. At 210, energy from either the power storage device 166, the energy harvesting circuitry, and/or the storage device charge management device is used to power gas control associated devices 172, such as the microcontroller 162, which provides commands and/or controls for a gas flow or pressure device (e.g., a valve, solenoid, and the like), a sensing device 130 (e.g., a pressure indicator or transducer), a display device 164 (e.g., a screen), a telemetry device 160 (e.g., transceiver, radio, cellular, or other communication type device), and/or an audible alarm 170 integrated onto the gas delivery system 110.

Figure 13:
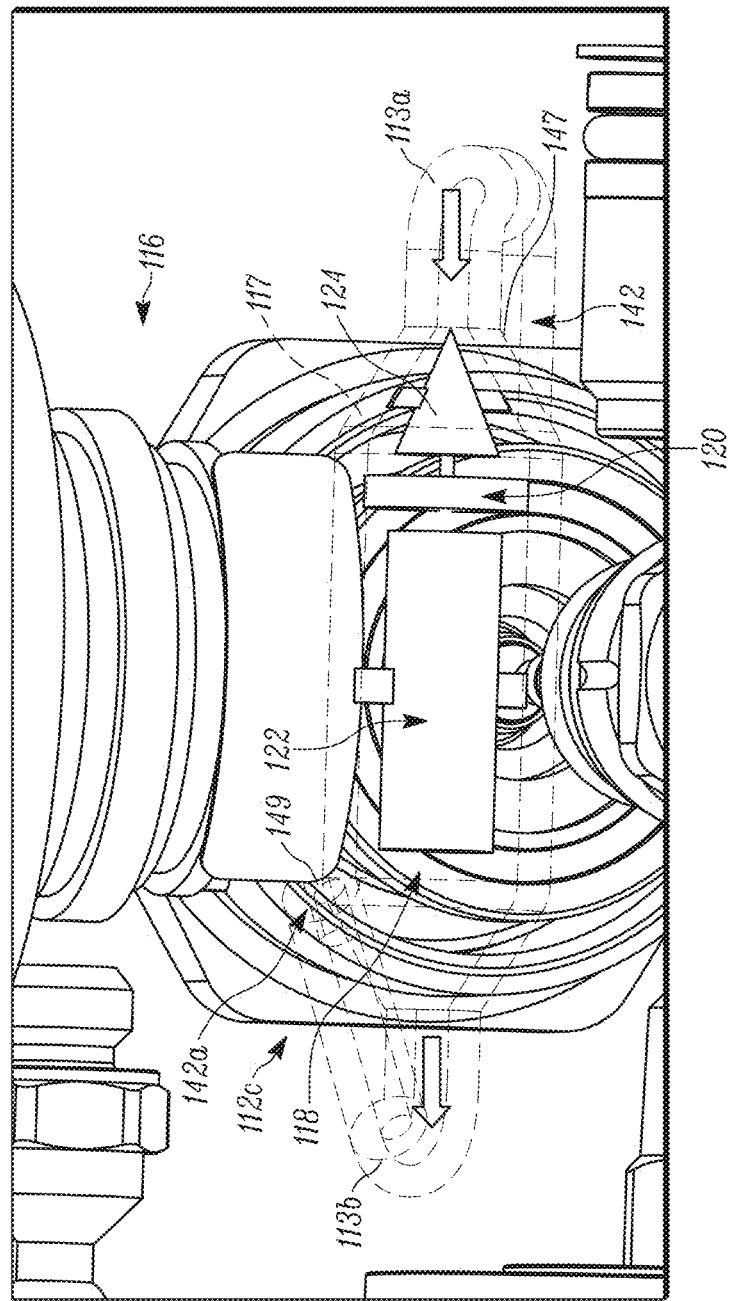
FIG. 13 illustrates a front view of a gas control device in fluid communication with a CGEHS wherein portions of the CGEHS are illustrated in phantom to show internal components of the CGEHS, in accordance with another example embodiment.
Figure 14:
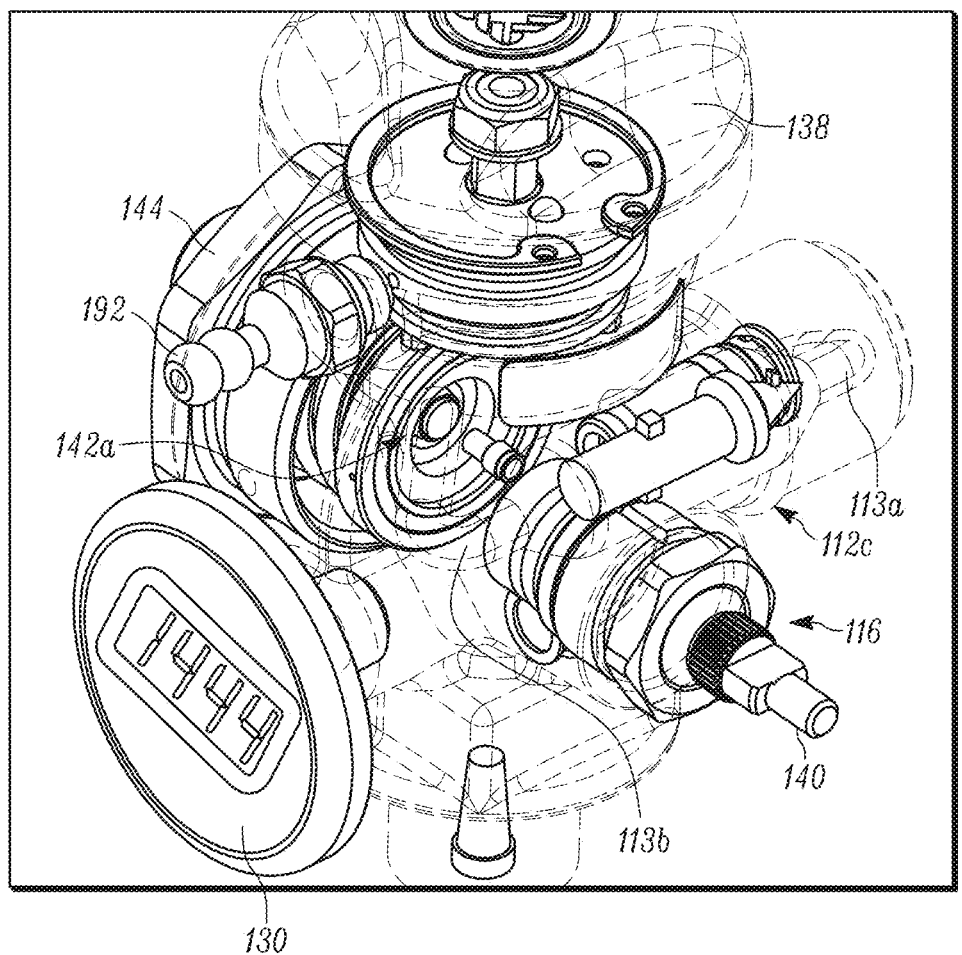
FIG. 14 is an upper left hand view of FIG. 13.
Figure 15:
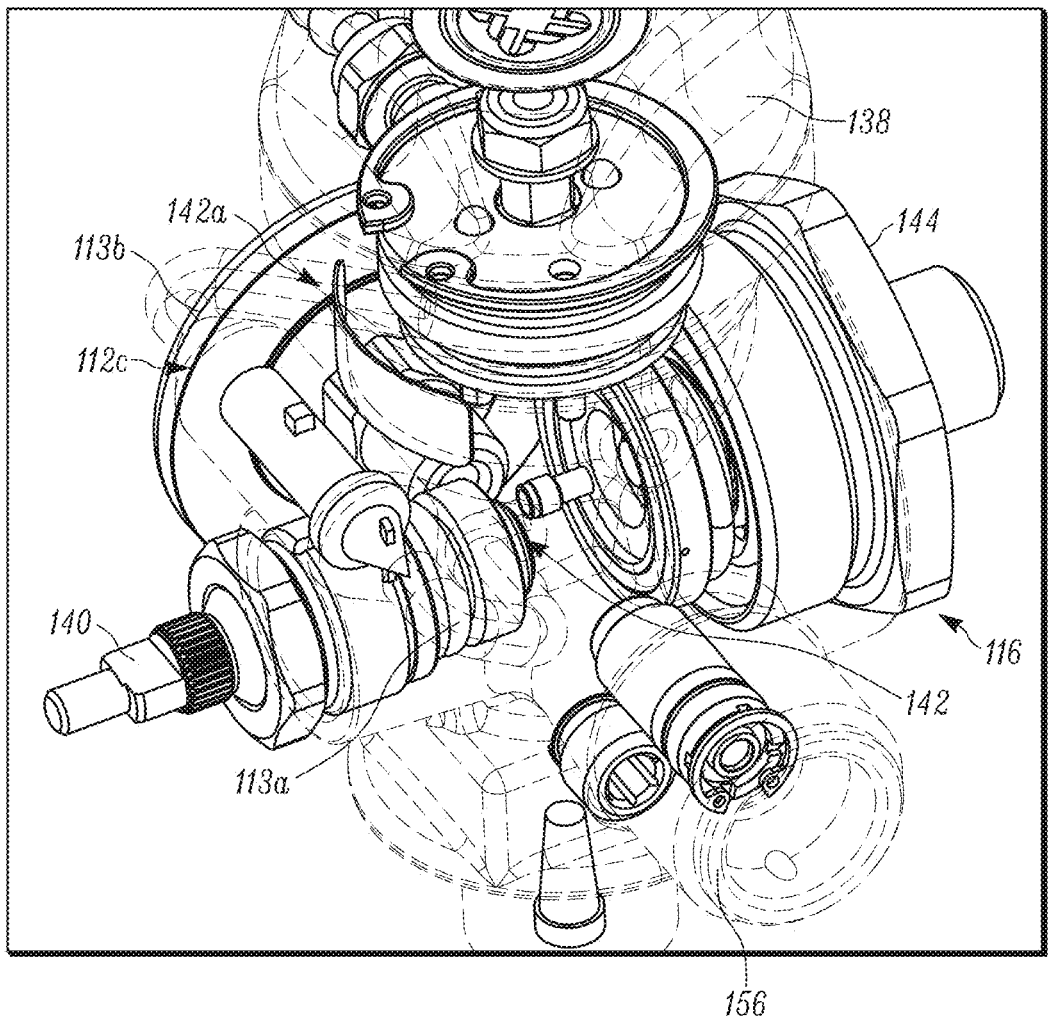
FIG. 15 is an upper right hand view of FIG. 13.
Figure 16:
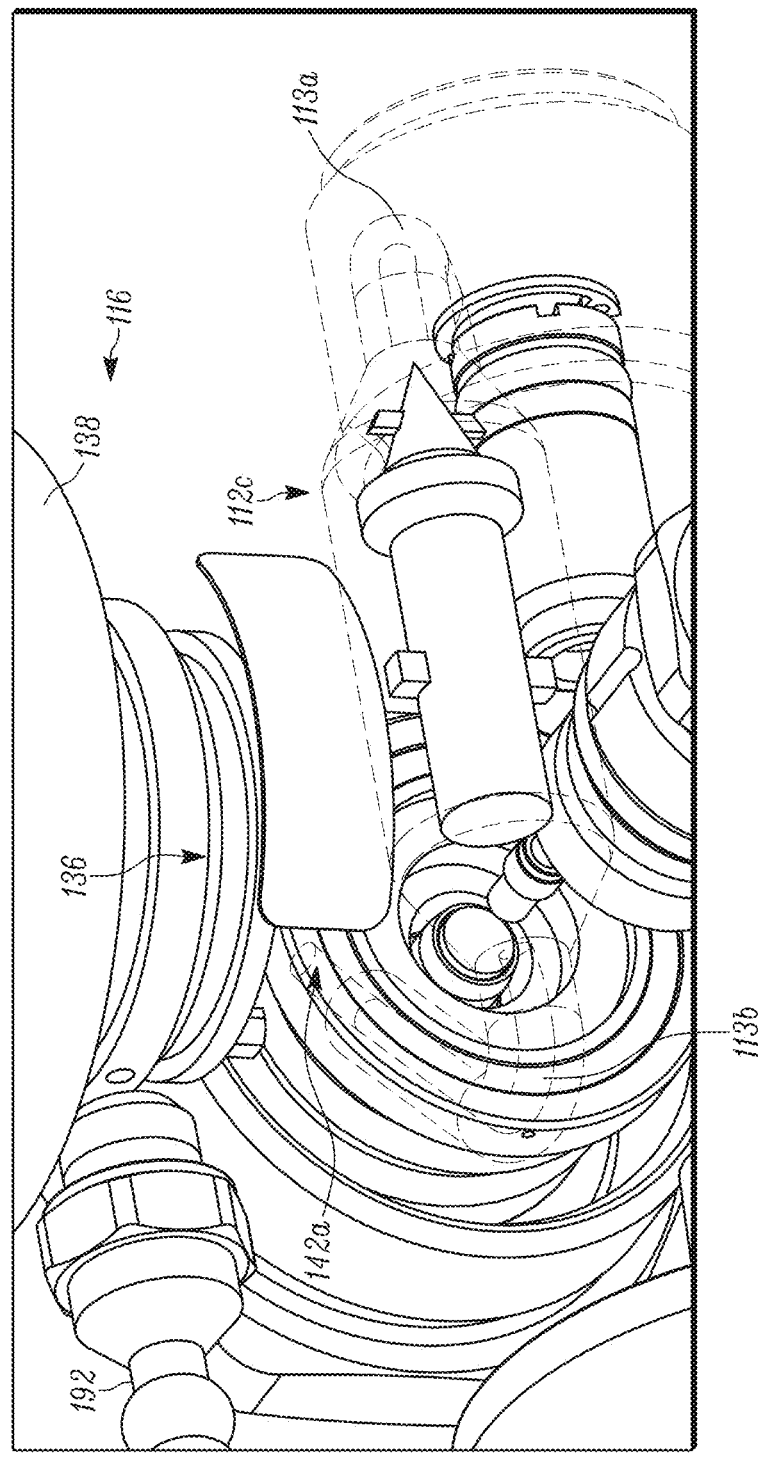
FIG. 16 is a magnified upper left hand view of FIG. 13.
Figure 17:
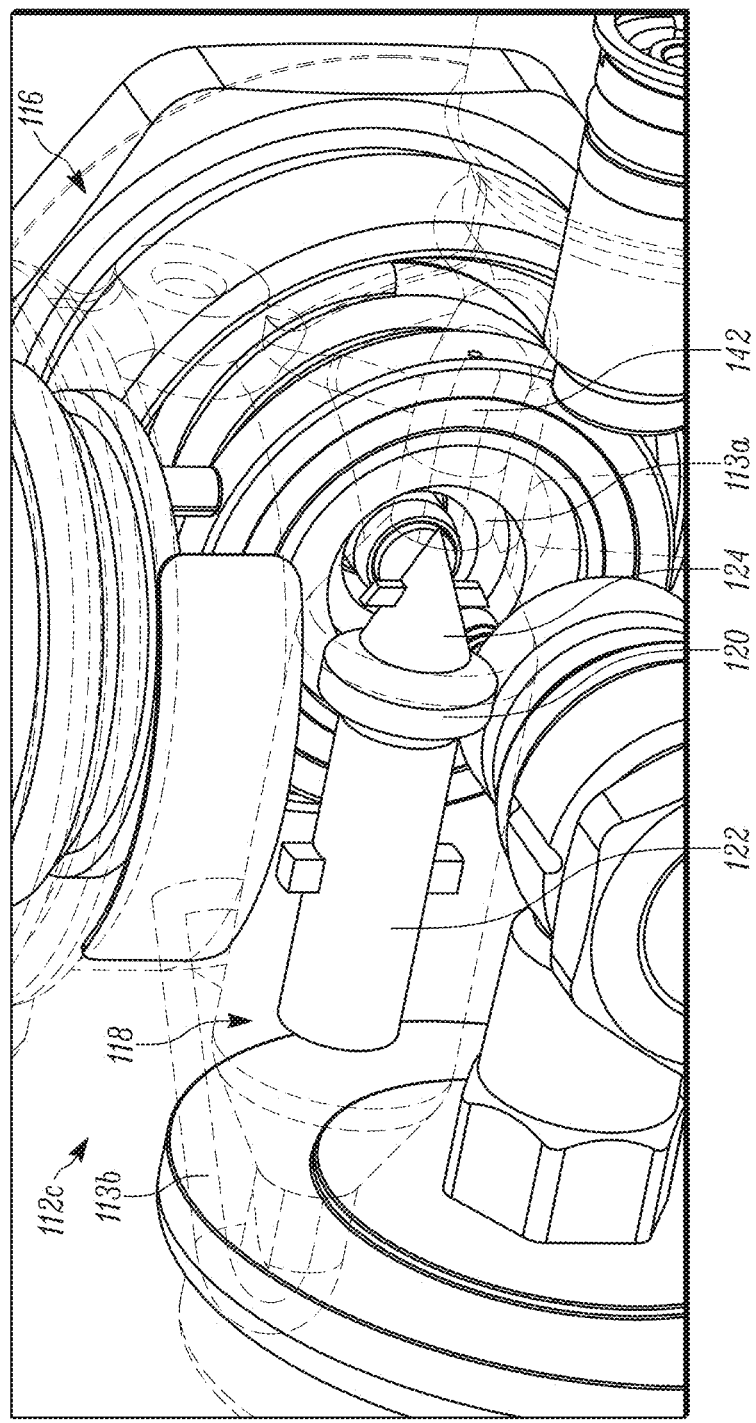
FIG. 17 is a magnified upper right hand view of FIG. 13.

As illustrated in FIGS. 7 and 13 the induction device 118 of the CGEHS 112c is in wired communication 166a with the power storage device 166 and/or with one or more of the power gas control associated devices 172. In one example embodiment, the induction device 118 uses induction charging to provide power (current or voltage) to the power storage device 166.

Figure 19:
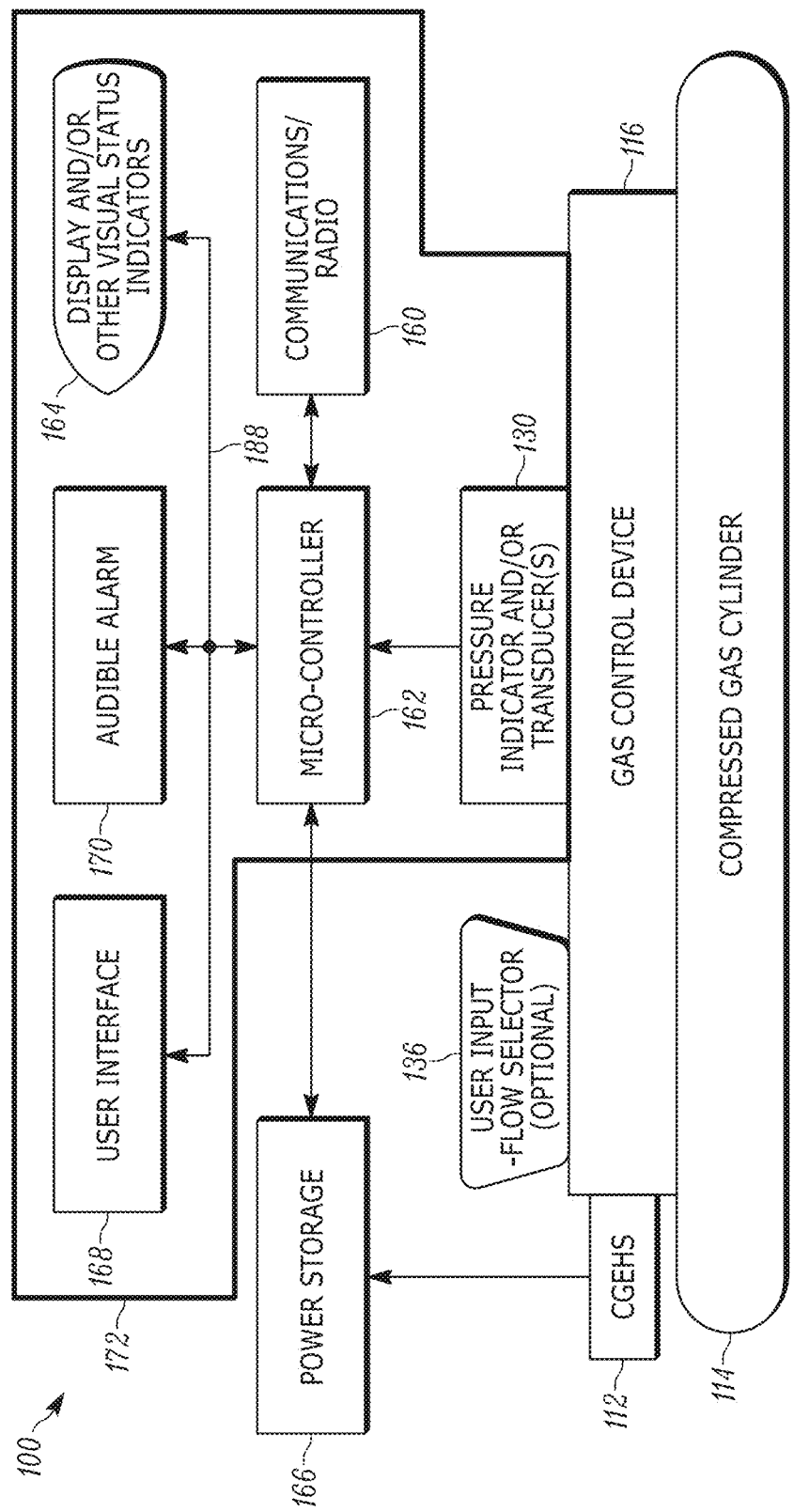
FIG. 19 is a flow chart illustrating components present in a compressed gas delivery system including a container, a gas control device, and a CGEHS integrated into the gas control device, in accordance with one example embodiment.

In the illustrated example embodiment of FIG. 19, an energy/electricity/current connectivity path is illustrated. Potential energy, stored in the compressed gas cylinder 114, travels through the gas control device 116, and thus the CGEHS 112, in the form of gasflow. In some embodiments, the gas additionally flows past a connection to the pressure gauge 130 and to the flow selector 136. In this example embodiment, energy generated by the CGEHS 12 is transmitted to the power storage device 166. Energy from the power storage device is provided to power the gas control associated devices 172. In one example embodiment, the power storage device 166 powers the microcontroller 162, as needed, which provides instructions to the user interface 168, the audible alarm 170 (e.g., an alarm that signals overpressure, under-pressure, low supply of gas in the cylinder 114, etc.), the display device 164, the communication device 160, and/or the pressure gauge 130 (e.g., such as when the pressure gauge is digital). In one example embodiment, the microcontroller 162 is in a smart loop 188 with at least one of the user interface 168, the audible alarm 170, the display device 164, the communication device 160, and/or the pressure gauge 130. The smart loop 188 includes bilateral communication, wherein the microcontroller 162 instructs the various gas control associated device 172, and receives feedback from those devices, wherein the smart loop includes the microcontroller generating instructions based upon the feedback. The microcontroller 162 requests and monitors power stored within the power storage device 166 The microcontroller 162 comprises a microprocessor. The microcontroller 162 comprises a printed circuit board (PCB) consisting of an application specific integrated circuit.

In one example embodiment, the display device 164 and/or the user interface 168 comprises a computer system and/or is in communication with a computer system. The computer system includes desktop, laptop, tablet hand-held personal computing device, IAN, WAN, WWW, and the like, running on any number of known operating systems and are accessible for communication with remote data storage, such as a cloud, host operating computer, via a world-wide-web or Internet. In another example embodiment, the microcontroller 162 comprises a function specific circuit board having for example, an application specific analog circuit (ASIC).

In another example embodiment, the microcontroller 162 communicates with the Internet, a short wave radio wave communication (e.g., Bluetooth) a network such as a LAN, WAN, and/or a cloud, input/output devices such as flash drives, remote devices such as a smart phone or tablet, and displays such as the user interface 168.

Advantageously, the CGEHS 112 enables access to a large amount of stored energy that is present in the compressed gas cylinder 114, the energy provides a relatively small amount of electrical energy that optionally powers the gas control associated devices 172 on the gas control device 116. Further, the CGEHS 112 utilizes various energy harvesting technologies, independently or in combination, including but not limited to piezoelectric, magnetic induction, and/or thermoelectric devices. Additionally, the CGEHS 112 harvests energy available from the movement of gas during system use, during cylinder (or other system) fill operations and/or during routine venting of gas from a cryogenic tank. Also, the CGEHS 112 harvests energy available from temperature differentials in a cryogenic tank, and/or temperature differentials created by gas expansion and/or compression during gas flow.

The electrical energy (e.g., transformed into alternating or direct electrical current, induction current, and/or some other usable form of energy) harvested by the CGEHS 112 is utilized to power and/or to charge a battery or other power storage device 166 for the gas control associated devices 172 in any gas control device 116. Power harvesting by the CGEHS 112 reduces and/or eliminates the need for routine power storage replacement in the gas control device 116 and/or any other devices in the compressed gas system. The power harvesting further reduces and/or eliminates these periodic maintenance requirements for the gas control associated devices 172 of the gas control device 116.

Electronic system expansion on the gas control device 116 electronics is enabled by the increase in onboard power availability. With the additional power available on-board from the harvesting, these electronic systems will no longer be constrained by the on-board power source capacity of the battery or other power storage device. Thus, additional power is employable to improve an overall utility of the gas control device 116 and the end user experience by enabling the use of electronics with greater power consumption requirements, including communications and telemetry capabilities, performing any desired electronic system functions more frequently, enabling use of larger, brighter information displays, and/or enabling a use of light emitting indicators and audible alarms.

The CGEHS 112 can be deployed in various ways, including being integrated into the gas control device 116 design, being externally connected to a gas flow path of the compressed gas delivery system 110, and/or being attached to a cryogenic tank.

The preferred embodiments of the disclosure have been illustrated and described in detail. However, the present disclosure is not to be considered limited to the precise construction disclosed. Various adaptations, modifications and uses of the disclosure may occur to those skilled in the art to which the disclosure relates and the intention is to cover hereby all such adaptations, modifications, and uses which fall within the spirit or scope of the appended claims.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art. In one non-limiting embodiment the terms are defined to be within for example 10%, in another possible embodiment within 5%, in another possible embodiment within 1%, and in another possible embodiment within 0.5%. The term "coupled" as used herein is defined as connected or in contact either temporarily or permanently, although not necessarily directly and not necessarily mechanically. A device or structure that is "configured" in a certain way is configured in at least that way, but may also be configured in ways that are not listed.

To the extent that the materials for any of the foregoing embodiments or components thereof are not specified, it is to be appreciated that suitable materials would be known by one of ordinary skill in the art for the intended purposes. All documents referenced herein are incorporated by reference in their entireties and for all purposes.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A compressed gas energy harvesting system (CGEHS) comprising:
    an energy converter for converting energy to electrical energy as fluid passes through the CGEHS;
    a first passage and a second passage of a gas control device coupled to and in fluid communication with said energy converter such that during use, fluid passes from the first passage to and by said energy converter into said second passage to exercise the energy converter along a fluid flow path to convert potential energy to electrical energy, the energy converter device removably and selectively in fluid communication with the fluid flow path, said gas control device comprising the first and second passages;
    at least one electrical component in electrical communication with said energy converter;
    a power storage device for providing power to the gas control device or one or more electrical components in communication with the gas control device connected to a compressed gas container and in fluid communication with a fluid within the compressed gas container; and
    a microcontroller powered by the power storage device, the microcontroller is in a smart loop with a pressure gauge comprised in the at least one electrical component, and the power storage device, wherein the smart loop includes bilateral communication between the microcontroller, the pressure gage, and the power storage device, the microcontroller generating instructions for the pressure gauge and power storage device based upon the bilateral communication.

2. The system of claim 1, wherein the energy converter comprises a potential energy converter that creates electrical current and comprises one of a piezoelectric device, a magnetic induction device, or a thermoelectric device.

3. The system of claim 2 where the energy from the electrical current is stored in the power storage device prior to being distributed to the one or more electrical components.

4. The system of claim 3 wherein another electrical component further comprises a sensor that senses a parameter of the gas delivery system.

5. The system of claim 4 wherein another electrical component comprises an electrical display for displaying one or more parameters sensed by the sensor of the gas delivery system.

6. The system of claim 5 wherein another electrical component is a controller for controlling at least one of gas flow and pressure within of the gas delivery system.

7. The system of claim 3 wherein said storage device provides energy to a controller that instructs the power storage device to provide power to at least one of a communications device to provide cellular, short-wave radio, or Wi-Fi functionality and a display device.

8. The compressed gas energy harvesting system of claim 1 wherein said energy converter is positioned on or in a gas control device such that said first and second passages are in fluid communication with fluid provided from a compressed gas container to said gas control device during operation.

9. A compressed gas energy harvesting system (CGEHS) for use in a gas delivery system, the CGEHS comprising:
    a power storage device for providing power to one or more electrical components in communication with a gas control device connected to a compressed gas container and in fluid communication with a fluid within the compressed gas container; and
    a potential energy converter coupled to the power storage device, the potential energy converter removably couplable to the gas control device, wherein the potential energy converter is removably coupled to the gas control device via a regulator input port and a regulator output port of the gas control device, wherein the fluid within the gas container flows through the potential energy convertor when the potential energy convertor is coupled to the gas control device, the potential energy converter further coupled to the one or more electrical components, said potential energy converter for supplying power to at least one of the power storage device and the one or more electrical components by converting the potential energy retained by the compressed gas container into electrical energy.

10. The system of claim 9, wherein the potential energy converter comprises one of a piezoelectric device, a magnetic induction device, and thermoelectric devices.

11. The subsystem of claim 10 wherein said electrical component further comprises a sensor that senses a parameter of the gas delivery system.

12. The subsystem of claim 11 wherein said electrical component further comprises an electrical display for displaying one or more parameters sensed by the sensor of the gas delivery system.

13. The subsystem of claim 10 wherein said electrical component is a controller for controlling at least one of flow and pressure of the gas delivery system.

14. The subsystem of claim 13 wherein said electrical component further comprises an electrical display for displaying one or more parameters controlled by the controller of the gas delivery system.

15. The subsystem of claim 9 wherein said electrical energy is used to provide electrical power to said one or more electrical components.

16. A compressed gas energy harvesting system (CGEHS) comprising:
    a power storage device for providing power to a gas control device or one or more electrical components in communication with the gas control device connected to a compressed gas container and in fluid communication with a fluid within the compressed gas container; and
    an induction device removably and selectively in fluid communication with a fluid flow path from the compressed gas container to a gas output port, said gas control device comprising first and second ports along the flow path, the induction device coupled to the flow path via the first and second ports, the induction device coupled to the power storage device and a controller that is in bilateral communication with and the one or more electrical components, said induction device providing a sole source of power to the power storage device by converting a potential energy retained by the compressed gas container into electrical energy by converting the fluid flowing through the induction device into electrical energy.

17. The compressed gas energy harvesting system of claim 16, the gas control device further comprising a pressure regulator and a flow selector, wherein a first flow path is defined between a pressure regulator output of the pressure regulator through the induction device and into a flow selector input of the flow selector.

18. The compressed gas energy harvesting system of claim 17 wherein the first port is defined along the pressure regulator output, and the second port is defined at along the flow selector input, wherein the induction device is fluidly coupled to the first and second ports, wherein gas flow from the pressure regulator output to the flow selector input causes the induction device to generate the electrical energy.

19. The compressed gas energy harvesting system of claim 16, wherein the induction device provides the sole source of power for the controller and the and the one or more electrical components, wherein the power storage device, the controller, and the one or more electrical components are removably and selectively coupled to the gas control device.

20. The compressed gas energy harvesting system of claim 16, wherein the first and second ports define an external opening in the gas control device.

* * * * *